(12) United States Patent
Yamada et al.

(10) Patent No.: US 10,472,543 B2
(45) Date of Patent: Nov. 12, 2019

(54) COATING LIQUID FOR FORMING PLANARIZATION FILM AND METAL FOIL COIL WITH PLANARIZATION FILM

(71) Applicant: NIPPON STEEL CHEMICAL & MATERIAL CO., LTD., Tokyo (JP)

(72) Inventors: Noriko Yamada, Tokyo (JP); Sawako Yamaguchi, Tokyo (JP); Koichi Nose, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 251 days.

(21) Appl. No.: 15/526,224

(22) PCT Filed: Nov. 12, 2015

(86) PCT No.: PCT/JP2015/081885
§ 371 (c)(1),
(2) Date: May 11, 2017

(87) PCT Pub. No.: WO2016/076399
PCT Pub. Date: May 19, 2016

(65) Prior Publication Data
US 2017/0313903 A1    Nov. 2, 2017

(30) Foreign Application Priority Data

Nov. 12, 2014    (JP) .................................. 2014-230111

(51) Int. Cl.
*C09D 183/04* (2006.01)
*C23C 14/34* (2006.01)
(Continued)

(52) U.S. Cl.
CPC ............. *C09D 183/04* (2013.01); *B05D 7/14* (2013.01); *B05D 7/24* (2013.01); *B32B 15/08* (2013.01);
(Continued)

(58) Field of Classification Search
CPC .......... C09D 183/04; C09D 7/63; C09D 7/20; C09D 7/40; C23C 14/3407; C23C 14/165;
(Continued)

(56) References Cited

U.S. PATENT DOCUMENTS

| | | | |
|---|---|---|---|
| 5,604,380 A | 2/1997 | Nishimura et al. | |
| 2010/0331481 A1 | 12/2010 | Kuniyoshi et al. | |
| 2011/0250392 A1* | 10/2011 | Woody | H01L 51/0097 428/141 |

FOREIGN PATENT DOCUMENTS

| | | |
|---|---|---|
| JP | 1-92224 A | 4/1989 |
| JP | 7-106328 A | 4/1995 |

(Continued)

OTHER PUBLICATIONS

Espacenet Translation of JP-2012140528-A (Year: 2019).*

*Primary Examiner* — Frank J Vineis
*Assistant Examiner* — Michael Zhang
(74) *Attorney, Agent, or Firm* — Birch, Stewart, Kolasch & Birch, LLP

(57) ABSTRACT

Problems to be Solved: To provide a metal foil coil with a planarization film, with which an electronic device can be formed by a roll to roll process. Solution: A quick curable coating liquid for a planarization film prepared by adding into an organic solvent, with respect to 1 mol of a phenyltrialkoxysilane, 0.1 mol to 1 mol of acetic acid and 0.005 mol to 0.05 mol of organic tin as a catalyst, hydrolyzing the silane with 2 mol to 4 mol of water, then distilling away the organic solvent at a temperature of 160° C. to 210° C. under reduced pressure to yield a resin, and dissolving the resin in an aromatic hydrocarbon solvent, is coated on a metal foil coil to a film thickness of 2.0 μm to 5.0 μm. When an insulation coating is provided on a metal foil coil before a planarization film is formed, high reliability for insulation (Continued)

can be obtained. When a stainless steel foil provided with a reflection film is used, a highly efficient light emitting device can be obtained.

10 Claims, 4 Drawing Sheets

(51) Int. Cl.
*C23C 14/16* (2006.01)
*C09D 7/00* (2018.01)
*C08G 77/00* (2006.01)
*C09D 7/40* (2018.01)
*B05D 7/14* (2006.01)
*B05D 7/24* (2006.01)
*B32B 15/08* (2006.01)
*C09D 7/20* (2018.01)
*C09D 7/63* (2018.01)
*C08G 77/08* (2006.01)

(52) U.S. Cl.
CPC ............... *C08G 77/08* (2013.01); *C09D 7/20* (2018.01); *C09D 7/40* (2018.01); *C09D 7/63* (2018.01); *C23C 14/165* (2013.01); *C23C 14/3407* (2013.01); *C08G 77/80* (2013.01)

(58) Field of Classification Search
CPC ........ C08G 77/08; C08G 77/80; B32B 15/08; B05D 7/24; B05D 7/14
See application file for complete search history.

(56) References Cited

FOREIGN PATENT DOCUMENTS

| | | | |
|---|---|---|---|
| JP | 7-166132 A | | 6/1995 |
| JP | 11-40829 A | | 2/1999 |
| JP | 2003-226753 A | | 8/2003 |
| JP | 2006-348303 A | | 12/2006 |
| JP | 2009-73964 A | | 4/2009 |
| JP | 2009-256662 A | | 11/2009 |
| JP | 2012-140528 A | | 7/2012 |
| JP | 2012140528 A | * | 7/2012 |
| JP | 5251904 B2 | | 7/2013 |
| JP | 2017-155309 A | | 9/2017 |
| WO | WO 2009/110405 A1 | | 9/2009 |

* cited by examiner

Schematic Diagram of Roll to Roll Film Formation Apparatus (a)

(b)

(c)

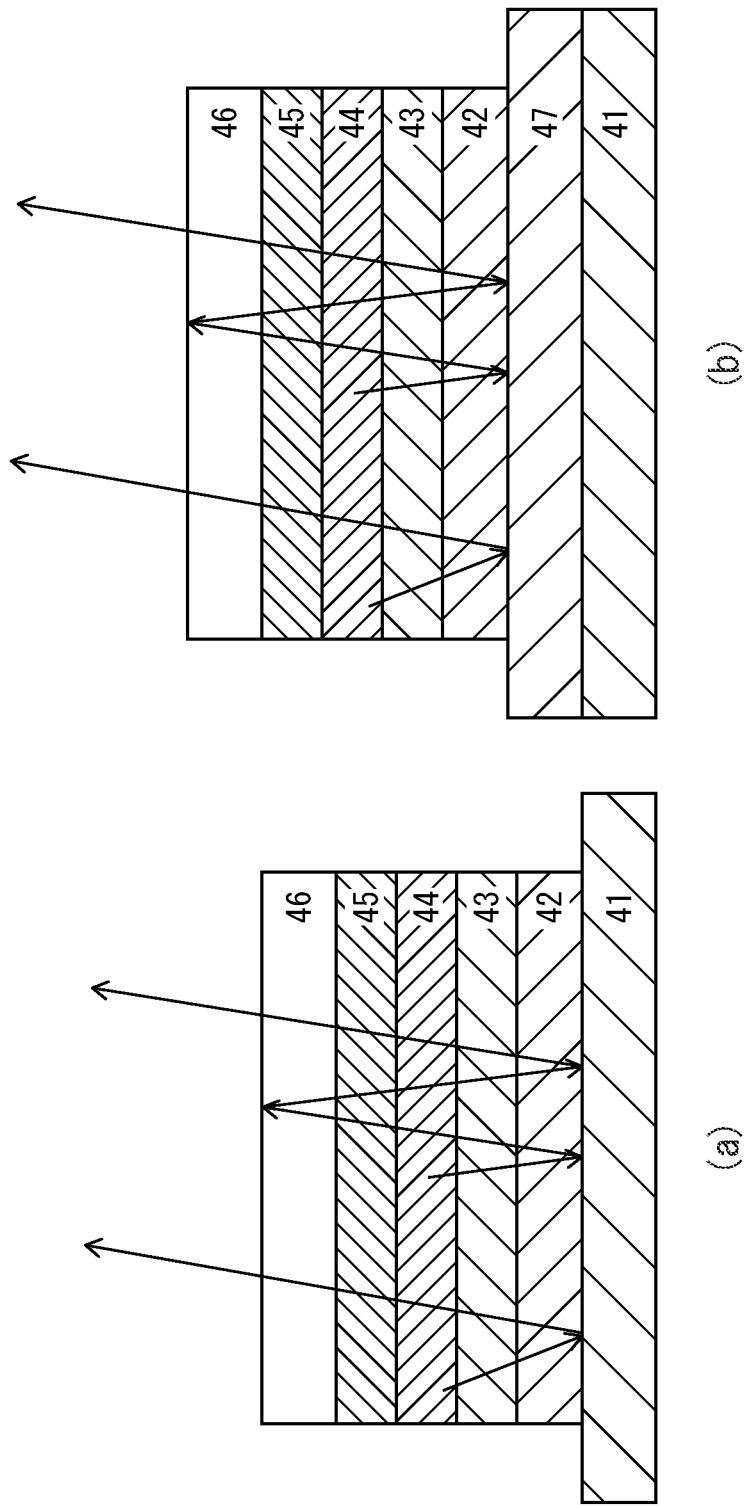
F I G. 4

COATING LIQUID FOR FORMING PLANARIZATION FILM AND METAL FOIL COIL WITH PLANARIZATION FILM

FIELD OF THE INVENTION

The present invention relates to a coating liquid for a planarization film applicable to a flexible substrate for an electronic device, and a metal foil coil with a planarization film.

DESCRIPTION OF THE RELATED ART

A flexible substrate is needed for an electronic device, such as electronic paper, an organic EL display, an organic EL light, and a solar cell. Although such a device has been heretofore formed on a glass substrate, if it is formed on a flexible substrate, even when it is dropped, it will not break, and a new use will be developed taking advantage of its light weight and plasticity. However, there is a drawback in a resin film being studied as a flexible substrate that the heat stability is poor and the dimensional stability is inferior, and in a thin glass which is fragile. There is a rolling mark or a scratch on the surface of a metal foil, and the surface roughness is inferior to glass. Therefore it is important for a film, which coats a metal foil, to planarize the surface of a metal foil as smooth as a glass substrate. The planarization film is further able to impart insulation performance to a metal foil.

Although the process temperature in producing an electronic device varies depending on the type and a constitutional material of the electronic device, when amorphous silicon required for an organic EL display, or a TFT of LTPS (low-temperature polysilicon) is produced, the process temperature is approx. from 300 to 400° C. Therefore, an insulation film to coat a metal foil is required to have heat stability enduring up to 400° C.

Examples of a film material to coat a metal foil include an inorganic-organic hybrid material. An organic material is insufficient in terms of heat stability. Further, when a foil is coated with an organic material, in a washing and drying step of a metal foil with a planarization film before formation of a device, a coated organic material may swell with an organic solvent for washing; and further, since removal of all moisture or a solvent absorbed by a coated organic material during washing by drying is difficult, the residue may have a negative influence on a device. Therefore, such an organic material is unsuitable. An inorganic material may crack, and cannot be easily deposited to form a film, which is so thick as to cover a rolling mark or a flaw on the surface of a metal foil. Therefore, an inorganic-organic hybrid material having moderate levels of heat stability and plasticity is suitable. As an insulation film from an inorganic-organic hybrid material, an organically-modified silica film is representative. Since it contains an organic group, it has higher plasticity than an inorganic film and can form a thick film easily. Since the main skeleton of an organically-modified silica film is formed based on an inorganic skeleton of Si-O, the heat stability is determined by the degradation temperature of an organic group modifying the main skeleton. When a methyl group or a phenyl group is selected as an organic group, a heat stability up to approx. 400° C. can be secured. Especially, a silica film modified with a phenyl group is superior in humidity resistance because the main skeleton of Si-O is resistant to hydrolysis owing to high hydrophobicity of a phenyl group, even in a high temperature and high humidity environment (e.g. in an accelerated environmental test at 85° C. and 85% RH). Therefore, a metal foil coated with a phenyl group modified silica film is preferable as a substrate for an electronic device.

When a device is formed on a flexible substrate, large-scale production at a low cost becomes possible by adopting a roll to roll process. For this purpose, not a metal foil sheet with a planarization film formed thereon, but a metal foil coil with a planarization film is needed. As a metal foil coil, one having a width of approx. 0.3 to 1.5 m and a length of approx. 50 to 2,000 m is supposed. As a promising method for coating such a metal foil coil with an inorganic-organic hybrid material, there is a method using a roll to roll film formation apparatus. A schematic diagram of a typical roll to roll film formation apparatus is depicted in FIG. 1. Ordinarily, a roll to roll film formation apparatus is constituted with an unwinding unit for setting an immaculate metal foil coil, onto which a film is to be formed, a coating unit for coating a coating liquid onto the metal foil coil, a drying unit, a heat treatment unit, and a winding unit for winding a metal foil coil, on which a film has been formed. Since in general a device is constructed on only a single side of a substrate, a planarization film may also be required to be coated on only a single side. Since after a coating liquid is painted and before the drying and heat treatment steps is finished, a film may contain a large amount of solvent or moisture, or the hardness of a film may be insufficient and vulnerable to a flaw, it is most desirable that conveying rolls should not touch the coated film surface in a drying furnace and a heat treatment furnace. In FIG. 1, rolls, which touch the coated film surface, are indicated by shading, and a substrate can be tensioned by holding the substrate between rolls touching the film surface and rolls touching the side opposite to the film surface.

Meanwhile, a drying furnace and a heat treatment furnace are configured such that a metal foil coil is conveyed horizontally, therefore for a material requiring a long drying and heat treatment time period, it is necessary to convey a metal foil very slowly or to build a long-sized furnace. However, with a facility in which a furnace length exceeds 10 m for meeting the condition that rolls do not touch the film surface in the furnace, not only the production cost increases, but also adjustment of a tension by holding the metal foil in the furnace is not possible even when the metal foil is distorted, and therefore meandering may occur or conveyance may become unstable. Supposedly the furnace length should be 10 m, a range, in which a heat treatment environment is secured in terms of maximum temperature or inert gas atmosphere, occupies only a part of the length. Consequently, for industrial production in a realistic facility, a material which can be heat-cured within a short time has been sought after. An aim is that a film can cure within a heat treatment time of 2 min.

In other words, for yielding a metal foil coil with a planarization film usable as a flexible device substrate, an inorganic-organic hybrid film which can cover the surface of a metal foil as smoothly as a glass substrate, impart insulation performance, and cure within 2 min, especially a silica film modified with a phenyl group has been sought after.

Patent Literature 1 discloses a stainless steel sheet coated with a material containing an organoalkoxysilane as an insulation substrate for a solar cell and a method for producing the same. Insulation performance, heat stability, and short time curing are achieved by forming a film with a coating liquid prepared by a so-called sol-gel process. However, a coating liquid prepared by a sol-gel process gelates when the solid content is high, and therefore contains a large amount of solvent. On the surface of a metal foil, there are a large number of rugged defects, such as a rolling mark and a flaw, and ordinarily hollows with a depth of several microns are recognized in various places. When a coating liquid with a low solid content concentration is coated on the surface of such a metal foil, the hollows are mitigated after evaporation of a solvent; however, complete planarization may not be expected.

Patent Literature 2 proposes a solventless phenyl group modified silica film as a countermeasure to the ruggedness which remains after evaporation of a solvent. Since the viscosity is selected such that coating without a solvent is possible, a precursor is a partially hydrolyzed product of a phenyltrialkoxysilane, in which reaction may be required to be progressed gradually, spending enough time in the drying and heat treatment processes. Since a long time treatment, namely the drying time after film formation of 45 min, and the heat treatment time at 300 to 400° C. of 45 min, is necessary, it may be difficult to form a film on a metal foil coil by a roll to roll process using the solventless coating liquid. This is because, when each treatment requires 45 min, assuming the sheet sending velocity of a metal foil coil at 3 mpm, a drying furnace and a heat treatment furnace, each with a length of 15 m, are required, which is an unrealistically long-sized facility with a high risk in conveyance such as meandering.

Patent Literature 3 discloses a material for planarizing a wiring level difference in a VLSI by utilizing reflowability. A silicone-based material composition is spin-coated, reflowed on a hot plate heated at 150° C. for 3 min, further heated for 3 min by raising the hot plate temperature to 200° C., and then thermally cured by heating the composition in a nitrogen stream at 450° C. for 30 min using a quartz tube. Planarization is attempted by reflowing a coated film; however, when film curing in a nitrogen stream at 450° C. for 30 min is to be performed by a roll to roll process, a long-sized facility is required as described above. Next, according to the procedures described in [0011] to [0020] of Patent Literature 3, phenyltriethoxysilane was hydrolyzed in ethanol using 0.01 mol of nitric acid and 1 mol of water with respect to 1 mol of phenyltriethoxysilane to obtain a reaction solution actually. A 50 μm-thick stainless steel foil of NSSC 190 SB with a coat of a film thickness of 1 μm formed by spin coating was heated on a hot plate at from 100° C. to 200° C. for from 1 min to 10 min. As the result, there was no recognizable difference with respect to coverage performance for ruggedness of a stainless steel foil between a sample dried at room temperature after coating and those dried through a heat treatment on a hot plate under various conditions. This is presumably because the level of wettability or reflowability of a reaction solution obtained by the method of Patent Literature 3 sufficed for the solution to flow adequately for planarization on a mirrored silicon wafer, but the solution could hardly flow on a stainless steel foil surface with a rolling mark or a scratch due to high level or frequency of ruggedness. In other words, even a material, which can planarize a mirrored silicon wafer, cannot always planarize a stainless steel foil surface with a large surface roughness.

Patent Literature 4 discloses an organic-coated glass film for planarization of a semiconductor substrate surface. According to Patent Literature 4, the reflowability can be acquired by regulating the amount of a methyl group and the amount of an acid catalyst with respect to 1 mol of an alkoxy silane. An organic-coated glass film is formed by performing reflow at 100° C. for 3 min, and further heating the film at 200° C. for 3 min, and in a nitrogen stream at 450° C. for 30 min. The organic-coated glass film also requires a long heat treatment time, and therefore is not suitable for roll to roll film formation. Since a methyl group-modified silica film has a low humidity resistance, using phenyltriethoxysilane and tetraethoxysilane, experiments were carried out actually by regulating the amount of a phenyl group and the amount of an acid catalyst referring to [0008] of the Patent Literature to know whether favorable reflowability can be acquired or not. Although coating liquids were prepared under various conditions using a hydrochloric acid catalyst and an acetic acid catalyst, and changing the amount of water with respect to an alkoxysilane, a stainless steel foil could not be smoothed adequately. The reason for the above is presumably the same as in the case of Patent Literature 3.

Patent Literature 5 discloses thermoplastic poly(phenylsilsesquioxane) and a method for producing high molecular weight poly(phenylsilsesquioxane) using the same. The thermoplastic poly(phenylsilsesquioxane) disclosed therein has a linear ladder structure with a weight-average molecular weight in a range of 1,000 to 4,000 and a melting point in a temperature range of 140 to 200° C., and is liquefied completely at a temperature beyond the melting point. When it is kept at a temperature at the melting point or higher, a condensation reaction advances to form high molecular weight poly(phenylsilsesquioxane). Although details are not known because Patent Literature 5 does not contain a description concerning a coating liquid or a coated film, thermoplastic poly(phenylsilsesquioxane) is allegedly soluble in a solvent, and therefore, when it is formed to a film on a metal substrate, it can be expected that the film is once liquefied between 140 and 200° C., then polymerization advances to a high molecular weight, and the film cures. It is believed that utilizing advantageously the liquefication between 140 and 200° C., the coating liquid, in a state in which the ruggedness of a metal foil is levelled out, can be cured to a film, thereby completing planarization. However, if the coating liquid is completely liquefied as described in [0016], it may flow down like raindrops from a metal foil coil, or leave a flow mark on the surface to deteriorate the flatness. Another drawback is in that high molecular weight poly(phenylsilsesquioxane) obtained by heating thermoplastic poly(phenylsilsesquioxane) according to Patent Literature 5 is soluble in a solvent, and that a long treatment time, such as 350° C. for 10 hours, or 250° C. for 24 hours, is necessary for polymerization to a high molecular weight. Since a metal foil with a planarization film is anticipated to be used as a device substrate, solvent resistance and chemical resistance in a step for device assembly are required and therefore after being cured to a film it should be chemically stable. In addition, that a long time is necessary for polymerization to a high molecular weight means that a long time is also necessary for curing the film.

With respect to thermoplastic poly(phenylsilsesquioxane) according to Patent Literature 5, a polymer free from a defect and having a linear ladder structure with a weight-average molecular weight of 1,000 to 4,000 has been obtained by hydrolyzing a phenyltrialkoxysilane with an acid, and thereafter advancing a condensation reaction under a mild condition using a basic catalyst. The polymer has an ideal ladder structure free from a defect as illustrated in FIG. 2 (a), and therefore it is inferred that the polymer is liquefied at the melting point, and even after polymerization to a high molecular weight, long ladder polymers are merely entangled and soluble in a solvent. Further, since in the case of an ideal structure, only terminals of a polymer can be reaction sites, it is inferred that a three-dimensional network structure can be hardly constructed, and a long time is necessary for polymerization to a high molecular weight and film curing.

Patent Literature 6 discloses a means using a phenyl silicone ladder polymer to be prepared by the production method disclosed in Patent Literature 7 for covering a wiring level difference in a semiconductor device. In Patent Literature 7, phenyltrichlorosilane is reacted using a basic catalyst to yield a phenyl silicone ladder polymer. According to the same, after coating. the coat is heat-treated at 150° C. and 250° C. for 30 min each, and then heat-treated at 400° C. for 1 hour. Patent Literatures 6 and 7 do not refer to existence of a melting point of a phenyl silicone ladder polymer, and allege that the film thickness can be made large easily, which is favorable for covering a wiring level difference. It is not clear if a film thickness large enough to planarize the surface of a metal foil can be obtained with the material, and even if it is possible, since a drying time and a heat treatment time are long, the material is not suitable for forming a film on a metal foil coil by a roll to roll process. An ideal structure of a phenyl silicone ladder polymer in Patent Literature 7 may be also depicted as FIG. 2(a) similar to poly(phenylsilsesquioxane) in Patent Literature 5. The reason for requiring a long drying time and heat treatment time is presumably that a ladder polymer close to the ideal structure is yielded similar to the material according to Patent Literature 5, and only terminals of a polymer can be reaction sites, so that a 3-dimensional network structure cannot be constructed easily.

Since the surface of a metal foil is so rough to include rolling marks, flaws, etc. as described above, with a coating liquid containing only hydrolysis products of an organoalkoxy silane, the ruggedness of a substrate remains after evaporation of a solvent, and the flatness is insufficient. Meanwhile, a solventless type, which may be able to improve the flatness, requires a too long heat treatment time, and is not suitable for roll to roll film formation. A reflow type planarization material used in a semiconductor field does not exhibit adequate planarization power on a metal foil. Although there remains possibility that phenyl silsesquioxane with a ladder structure, or phenyl ladder silicone, which can exhibit thermoplasticity, or form easily a thick film, may be applied to planarization of a metal foil surface, either of them as they are, is not suitable for roll to roll film formation due to a long heat treatment time.

CITATION LIST

Patent Literature

[Patent Literature 1] Japanese Laid-open Patent Publication No. 11-40829
[Patent Literature 2] Japanese Laid-open Patent Publication No. 2012-140528
[Patent Literature 3] Japanese Laid-open Patent Publication No. 2006-348303
[Patent Literature 4] Japanese Laid-open Patent Publication No. 07-166132
[Patent Literature 5] Japanese Laid-open Patent Publication No. 2003-226753
[Patent Literature 6] Japanese Laid-open Patent Publication No. 07-106328
[Patent Literature 7] Japanese Laid-open Patent Publication No. 01-92224

SUMMARY OF THE INVENTION

Technical Problem

Therefore, by a conventional technology, only a cut sheet of a metal foil is coated with a planarization material, and then heat-treated in a batch-wise furnace to yield a metal foil with a planarization film. However, for the sake of large-scale production or cost reduction of an electronic device, it becomes necessary to provide a roll of a metal foil with a planarization film, which is used as a flexible substrate, so that a device itself can be produced by a roll to roll method. Since by a conventional technology a long heat treatment time is necessary for planarization, when a film is formed by a roll to roll method, not only an apparatus needs to be long-sized, but also there is a problem that stable conveyance of a metal foil without meandering is difficult.

The present invention was made for solving the problems with an object to provide a quick-curing coating liquid for a planarization film, with which the surface of a metal foil coil can be planarized as smooth as a glass substrate by a roll to roll process, as well as a metal foil coil planarized therewith. Moreover, the planarization film is a film having both heat stability and humidity resistance.

Solution to Problem

The present invention provides the following.

(1) A coating liquid for a planarization film prepared by adding into an organic solvent with respect to 1 mol of a phenyltrialkoxysilane, 0.1 mol to 1 mol of acetic acid and 0.005 mol to 0.05 mol of organic tin as a catalyst, hydrolyzing the silane with 2 mol to 4 mol of water, then distilling away the organic solvent at a temperature of 160° C. to 210° C. under reduced pressure to yield a resin, and dissolving the resin in an aromatic hydrocarbon solvent.

(2) A method for producing a coating liquid for a planarization film prepared by adding into an organic solvent with respect to 1 mol of a phenyltrialkoxysilane, 0.1 mol to 1 mol of acetic acid, and 0.005 mol to 0.05 mol of organic tin as a catalyst, hydrolyzing the silane with 2 mol to 4 mol of water, then distilling away the organic solvent at a temperature of 160° C. to 210° C. under reduced pressure to yield a resin, and dissolving the resin in an aromatic hydrocarbon solvent.

(3) A metal foil coil with a planarization film, in which the surface of the metal foil coil is coated with a phenyl group-modified silica film with a film thickness of 2.0 μm to 5.0 μm and Ra of 30 nm or less in the direction perpendicular to the rolling direction, formed by coating the coating liquid according to (1) above onto a metal foil coil, and thereafter letting the coated film reflow and cure by a heat treatment process.

(4) A method for producing a metal foil coil with a planarization film, by which the coating liquid according to (1) above is coated continuously onto a metal foil coil to a film thickness of 2.0 μIn to 5.0 μm, the coated foil is passed through a heat treatment furnace in an inert gas atmosphere at between 300° C. and 450° C. for letting the coated film reflow and cure, and then the coated foil is wound up.

(5) The metal foil coil according to (3) above, wherein the metal foil is a stainless steel foil.

(6) The method for producing the metal foil coil according to (4) above, wherein the metal foil is a stainless steel foil coil.

(7) An insulation-coated metal foil coil with a planarization film, in which the surface of an insulation-coated metal foil coil is coated with a phenyl group-modified silica film with a film thickness of 2.0 μm to 5.0 μm and Ra of 30 nm or less in the direction perpendicular to the rolling direction, formed by coating the coating liquid according to (1) above onto an insulation-coated surface of an insulation-coated metal foil coil having an insulation film coated on at least either surface of the metal foil coil, and thereafter letting the coated film reflow and cure by a heat treatment process.

(8) A method for producing an insulation-coated metal foil coil with a planarization film, by which the coating liquid according to (1) above is coated continuously onto an insulation-coated surface of an insulation-coated metal foil coil, having an insulation film coated on at least either surface of the metal foil coil, to a film thickness of 2.0 μm to 5.0 μm, the coated foil is passed through a heat treatment furnace in an inert gas atmosphere at between 300° C. and 450° C. for letting the coated film reflow and cure, and then the coated foil is wound up.

(9) A reflection film-formed stainless steel foil coil with a planarization film, in which the surface of the reflection film-formed stainless steel foil coil is coated with a phenyl group-modified silica film with a film thickness of 2.0 μm to 5.0 μm and Ra of 30 nm or less in the direction perpendicular to the rolling direction, formed by coating the coating liquid according to (1) above onto a reflection film-formed surface of a reflection film-formed stainless steel foil coil, having a reflection film formed on at least either surface of the metal foil coil, and thereafter letting the coated film reflow and cure by a heat treatment process.

(10) A method for producing a reflection film-formed stainless steel foil coil with a planarization film, by which the coating liquid according to (1) above is coated continuously onto a reflection film-formed surface of a reflection film-formed stainless steel foil coil, having a reflection film formed on at least either surface of the metal foil coil, to a film thickness of 2.0 μm to 5.0 μm, the coated foil is passed through a heat treatment furnace in an inert gas atmosphere at between 300° C. and 450° C. for letting the coated film reflow and cure, and then the coated foil is wound up.

ADVANTAGEOUS EFFECTS OF INVENTION

According to the present invention, a quick curable coating liquid for a planarization film applicable to a roll to roll process, and a metal foil coil with a planarization film can be provided. Furthermore, the planarization film is superior in humidity resistance, so as not to affect negatively an organic semiconductor vulnerable to moisture, and has heat stability up to 400° C., which is a production temperature for LIPS. When a coating liquid for a planarization film according to the present invention is applied to an insulation-coated metal foil coil, an insulation-coated metal foil coil with a planarization film exhibiting high insulation reliability is obtained. When the same is applied to a stainless steel foil, on which a reflection film is formed, a reflection film-formed stainless steel foil coil with a planarization film able to provide a highly efficient light emitting device is obtained.

BRIEF DESCRIPTION OF THE DRAWINGS

FIG. 4(a) is an example of a top emission organic EL device produced on a stainless steel foil; and (b) is an example of a top emission organic EL device produced on a reflection film-formed stainless steel foil.

DESCRIPTION OF THE EMBODIMENTS

For yielding a metal foil coil with a planarization film, it is important to satisfy 2 requirements at the same time that a film reflows to smooth out the ruggedness of the surface of a metal foil in a curing step from a viewpoint of planarization, and that the film can cure within a heat treatment time of 2 min or less, enabling film formation by a roll to roll process.

The inventors have found a method to satisfy both the requirements with a phenyl group-modified silica film superior in heat stability and humidity resistance. A coating liquid for forming a highly planarizing and rapidly curable phenyl group-modified silica film according to the present invention is prepared by adding into an organic solvent with respect to 1 mol of a phenyltrialkoxysilane, 0.1 mol to 1 mol of acetic acid and 0.005 mol to 0.05 mol of organic tin as a catalyst, hydrolyzing the silane with 2 mol to 4 mol of water, then distilling away the organic solvent used for hydrolysis of the phenyltrialkoxysilane, and water and an alcohol as reaction byproducts at a temperature of 160° C. to 220° C. under reduced pressure to yield a resin, and dissolving the resin in an aromatic hydrocarbon solvent. The aromatic hydrocarbon solvent having dissolved the resin is clarified by filtration.

A solution after the hydrolysis had a viscosity of 1 to 2 mPa·s, and was transparent. A weight-average molecular weight reduced to styrene determined by GPC (gel permeation chromatography) was 300, indicating that the product was a single molecule or a condensation product of approx. 2 molecules of a partially hydrolyzed phenyltrialkoxysilane. For distillation under reduced pressure, the temperature is gradually raised starting from room temperature avoiding bumping. When a solvent in 600 mL of a hydrolysis solution is distilled away under reduced pressure by a rotary evaporator using an oil bath, the oil bath is kept at 50° C. for approx. 30 min until the solvent evaporates no longer, then the temperature of the oil bath is raised to 130° C. and kept at the temperature for 30 min until the solvent evaporates no longer. Due to the temperature increase and the solvent removal, the solid concentration increases, and the viscosity of the solid becomes higher to develop stringiness. By raising the temperature of the oil bath to between 160 and 210° C., keeping the temperature for 30 min until the solvent evaporates no longer, and keeping the temperature for another 15 min, the solvent can be removed completely. When almost all the solvent is removed, the solid, namely a stringy resin, comes to lose flowability in a range of 160 to 210° C. The then obtained resin is a translucent to white solid at room temperature. The weight-average molecular weight reduced to styrene determined by GPC after dissolving the resin in an aromatic hydrocarbon solvent was 5,000 to 100,000.

Figure 2:
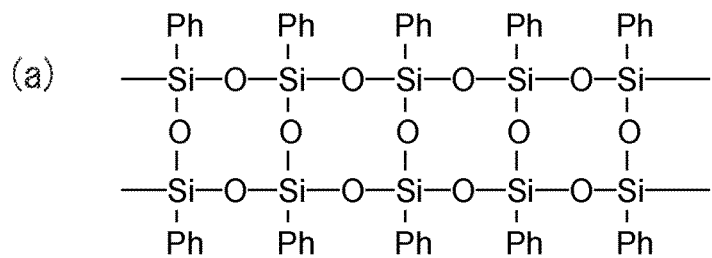
FIG. 2(a) is a schematic diagram of a structure of a phenyl siloxane ladder polymer—ideal form; (b) is a defective site branched to a ladder polymer; and (c) is a defective site terminated with reactive groups.
Figure 2:
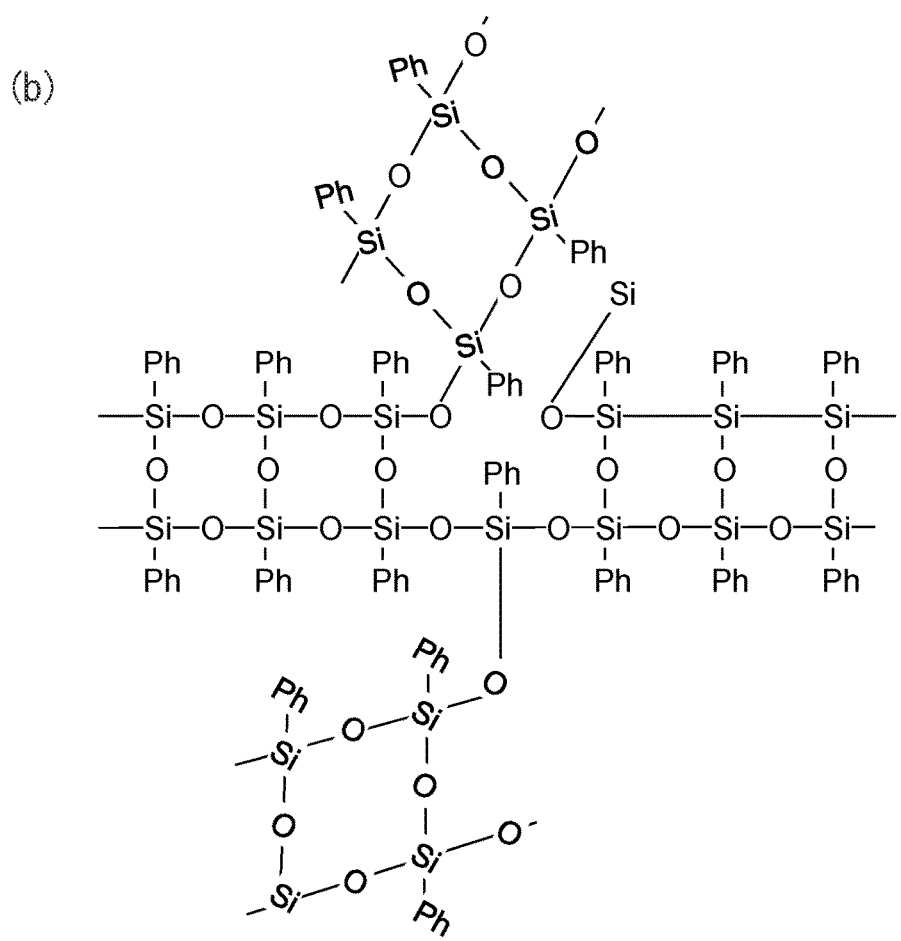
Figure 2:
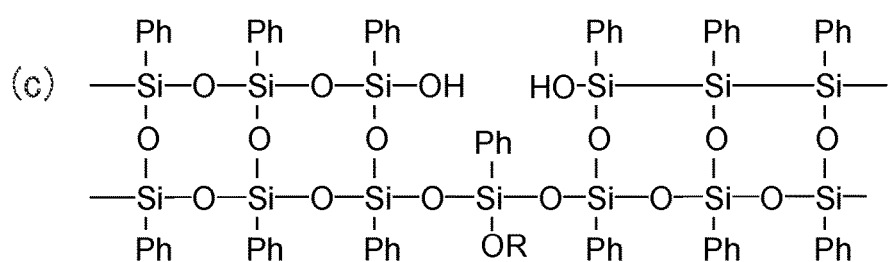

From the facts that the resin exhibited stringiness, that it was dissolved in a solvent despite its high molecular weight, and that there were double peaks near 1,100 $cm^{-1}$ in its infrared absorption spectrum attributable to a siloxane bond, it is presumed that a resin derived from phenyltriethoxysilane as a source material according to the present invention is in a form close to a ladder structure. An ideal structure of a phenyl siloxane ladder polymer (a phenyl group-modified silica film with a ladder structure) is illustrated in FIG. 2(a) as described in connection with Patent Literature 5 and 7. An actual ladder polymer includes a defect, and in some cases each Si at a defective site may branch to form a ladder polymer as in FIG. 2(b), and in some other cases each Si may terminate as a reactive group, such as a silanol group and an alkoxy group as in FIG. 2(c). Also in some other cases Si that branches and Si that forms a silanol group may coexist at a single defective site. In some other cases a branched part may be connected not with a ladder polymer, but with phenyl siloxane with a random structure. Depending on the structure of a defective site, the defect density, or the molecular weight of a ladder polymer, the properties of a phenyl siloxane ladder polymer vary. A polymer close to the perfect ladder structure of FIG. 2(a) is dissolved well in a solvent since the ladder polymer is linear, and when a coating liquid having such a ladder polymer dissolved is coated and the solvent is removed by evaporation, a dried film with entangled ladder polymers can be formed. When the dried film is heated, the entangled ladder polymers start moving by thermal vibrations to develop flowability (reflowability). When the heating temperature is raised, a part of phenyl groups are thermally degraded and bond to terminals of ladder polymers to crosslink and form a network structure causing heat curing. The polymers in Patent Literature 5 and 7 also described above are believed to belong to the type of FIG. 2(a). When a polymer is branched as in FIG. 2(b), the larger the molecular weight of a ladder polymer is, and the larger the number of branches is, the more completely a three-dimensional network structure is formed, and therefore conceivably the polymer becomes less soluble in a solvent, and less reflowable by heating compared to the case of FIG. 2(a). A linear ladder polymer including many reactive groups at a defective site as illustrated in FIG. 2(c) is easily soluble in a solvent and exhibits reflowability similar to FIG. 2(a) because of the linearity. Since there is a large number of reactive groups in a ladder polymer itself and a network structure can be formed by crosslinking without waiting for the thermal degradation of phenyl groups as in the case of thermal curing of a ladder polymer having an ideal structure of FIG. 2(a), it can be thermally cured within a short time period. It is presumed that the structure illustrated in FIG. 2(c) is obtained according to the present invention, as described below.

In Patent Literatures 6 and 7, a ladder polymer is synthesized using an alkali catalyst. Generally, when an alkoxy group of an alkoxy silane is hydrolyzed in the presence of an alkali catalyst, the second alkoxy group of the alkoxy silane becomes easier to hydrolyze. In other words, taking a phenyltrialkoxysilane as an example, if there are 2 molecules of $PhSi(OR)_3$, $PhSi(OH)_2OR$ and $PhSi(OR)_3$ will result eventually. In contrast, in the presence of an acid catalyst, a hydrolysis reaction proceeds more uniformly, and 2 molecules of $PhSiOH(OR)_2$ will result. With respect to a condensation reaction, in the presence of an alkali catalyst, condensation occurs selectively among highly hydrolyzed molecules. In contrast, in the presence of an acid catalyst, since all molecules are hydrolyzed uniformly, a condensation reaction proceeds also uniformly. It is presumed that the structure of a ladder polymer containing phenyl groups of the present invention is different from those of Patent Literatures 6 and 7 synthesized with an alkali catalyst, reflecting the difference in progress of the hydrolysis and condensation reactions in the initial stage. Conceivably, in the case of Patent Literatures 6 and 7, since an alkali catalyst is present, almost no alkoxy group nor hydroxy group remains in the condensation reaction product; on the other hand, according to the present invention, since an acid catalyst is used, although the structure is akin to a ladder polymer, a relatively large number of alkoxy groups or hydroxy groups remain at a defective site to retain many reactive groups, among which a condensation reaction advances during a heat treatment, such that a film can cure during a short time. In this regard, film curing means that both of the following conditions are satisfied, namely the pencil hardness of a film after a heat treatment becomes 3H or higher so that the film is resistant to a scratch, and an insulation film with a film leakage current of $1E-6$ $A/cm^2$ or less is formed through volatilization of an ingredient in a film to cause leakage of an insulation film, such as a solvent and moisture. A leakage current of an insulation film is measured by applying a voltage of 100 V between a metal foil and a 1 cm-square upper electrode formed on a phenyl group-modified silica film.

A condensation reaction is further promoted during a heat treatment by Sn originated from an organic tin added as a catalyst according to the present invention, such that a film can cure within a time period as short as 2 min at 300 to 450° C., which enables a continuous heat treatment. On the other hand, according to Patent Literature 6 and 7, there is almost no reactive group in a ladder polymer, and for heat curing in the first place a phenyl group should be, for example, thermally degraded to form once a silanol group, and condensation proceeds between the silanol groups, which conceivably requires a longer heat treatment time. Further, a phenyl group-modified silica film according to the present invention exhibits favorable reflowability; however there is no mention of reflowability or thermoplasticity in Patent Literature 6 and 7. This is conceivably because a phenyl siloxane ladder polymer according to the present invention has no branch and the ladder polymers are merely entangled each other while a ladder polymer according to Literatures 6 and 7 has a large number of branches, by which the polymer cannot flow easily.

Patent Literature 5 discloses a thermoplastic poly(phenylsilsesquioxane), and a method for producing a high molecular weight poly(phenylsilsesquioxane) using the same. According to Patent Literature 5, after phenyltriethoxysilane is hydrolyzed with an acid, condensation is carried out using sodium carbonate, therefore a catalyst in producing a ladder polymer is alkaline. Therefore the structure of an obtainable polymer is different from that according to the present invention, and presumably does not include a reactive group at a defective site identically with Patent Literatures 6 and 7. However, since it is thermoplastic, the number of branches is presumably less than those of Patent Literatures 6 and 7. Actually, Patent Literature 5 mentions that the object thereof is to yield a linear ladder polymer free from a defect. A polymer synthesized using an alkali catalyst as in Patent Literature 5 contains an impurity such as Na harmful to a semiconductor device; however according to the present invention, since no alkali is used, there is no risk of contamination with an alkali.

The characteristics of a phenyl group-containing silica film according to the present invention may be summarized as follows. According to the present invention, a film is composed of a high molecular weight resin with a structure akin to a ladder polymer including phenyl groups. A phenyl siloxane ladder polymer according to the present invention is not branched at a defective site and is terminated with a silanol group or an alkoxy group as in FIG. 2(c). The weight-average molecular weight reduced to styrene is 5,000 to 100,000. Since it is a ladder-shaped long polymer, a film after coating and drying has a structure in which ladder polymers are entangled with each other. Since an apparent 3-dimensional network structure is constructed through entanglement of ladder polymers, it is a film in a dry and not adhesive state. When the resin is heated to the vicinity of a synthesis temperature, it becomes gradually flowable, and above the synthesis temperature, entanglement is loosened and the resin becomes soft and starts reflowing. Since there are many reactive groups at a defective site in a polymer according to the present invention as described above, a polymer secures adherence to a substrate owing to the reactive groups, while ladder polymers move so as to minimize the surface energy as a whole. Immediately after coating and drying, ruggedness is recognizable on a film surface reflecting ruggedness or flaws on a stainless steel foil surface, but at a temperature beyond a resin synthesis temperature, the film surface will reflow to minimize the surface area to the extent possible, namely come into a flat state. A ladder polymer with a small number of branches is obtained according to the present invention, and therefore the flowability can be high, and a smoothing effect can be excellent. When the heat treatment temperature exceeds 300° C., crosslinking between ladder polymers through reactive groups starts progressing. As above, a phenyl group-modified silica film according to the present invention can cover ruggedness on a stainless steel foil.

Next, parameter conditions for yielding a highly smoothing film according to the present invention will be described. A mol number is a value with respect to 1 mol of a phenyltrialkoxysilane unless otherwise specified.

The amount of acetic acid during a synthesis of a coating liquid has a strong influence on progress of hydrolysis of a phenyltrialkoxysilane. When the amount of acetic acid is less than 0.1 mol, only a part of phenyltrialkoxysilane is hydrolyzed, and therefore a polycondensation reaction thereafter does not advance well so that a resin can have only a low molecular weight. Unless the length of a ladder polymer does not exceed a certain value, entangled polymers are disentangled by thermal vibrations and fail to exhibit reflowability, and therefore it is not suitable. When the amount is beyond 1 mol, all alkoxy groups of almost all of phenyltrialkoxysilane are hydrolyzed, and therefore a polycondensation reaction thereafter advances too rapidly, gelation occurs in the stage of hydrolysis before vacuum distillation, and therefore it is not suitable.

Organic tin is a catalyst for promoting a polycondensation reaction of a phenyltrialkoxysilane and a condensation reaction product of hydrolyzed products thereof, and a phenyl group containing-ladder polymer. When organic tin is less than 0.005 mol, the condensation reaction promotion effect for a ladder polymer during a heat treatment is inadequate, and rapid curing is not any more possible, and therefore it is not suitable. When organic tin exceeds 0.05 mol, polycondensation of a phenyltrialkoxysilane and a condensation reaction product of hydrolyzed products thereof advances too far, and gelation occurs in the stage of hydrolysis before vacuum distillation, and therefore it is not suitable.

When the amount of water to be used for hydrolysis is less than 2 mol, a large amount of alkoxy group remains in a resin, and therefore a condensation reaction (formation of a ladder polymer) is required to be performed during a heat treatment. For this purpose a heat treatment at 350 to 450° C. for 2 min is insufficient in terms of heat treatment time, so that a solvent or moisture remains in a film to cause insulation failure, and therefore it is not suitable. When the amount of water exceeds 4 mol, hydrolysis proceeds rapidly, so that a random network structure is formed rather than a ladder-shaped orderly structure, and consequently, the solubility of a resin is lost, and a coating liquid cannot be prepared, and therefore it is not suitable. When the temperature at the vacuum distillation is lower than 160° C., a condensation reaction of the resin is insufficient and the molecular weight distribution of the resin after dissolution becomes irregular, so that a low molecular weight portion volatilizes during film formation to generate a cissing-like defect, and therefore it is not suitable. When the temperature at the vacuum distillation exceeds 210° C., a condensation reaction advances too far and the resin cannot be dissolved easily, and therefore it is not suitable. A more preferable temperature at vacuum distillation is from 180° C. to 200° C. The viscosity of a coating liquid may be adjusted by the quantitative ratio of resin to solvent, namely by the solid content. The optimum viscosity and solid content depends on a coating method, and generally when the solid concentration is regulated between 15 mass-% and 40 mass %, and the viscosity between 3 mPa·s and 100 mPa·s, a film with a film thickness between 2 to 5 μm can be uniformly coated, and the storage stability of the coating liquid is also excellent.

Next, a metal foil with a planarization film using a phenyl group-modified silica film according to the present invention will be described.

Since the thickness of a metal foil is reduced by rolling, a rolling mark in the rolling direction is recognizable. Further, a flaw generated by being stretched in the rolling direction by an inclusion included in an original molten metal, or a foreign substance caught by a rolling mill roll may be present. The size of a flaw is frequently several tens of micron-wide, and 1 to several millimeter-long.

The surface roughness of a metal foil is different between the direction parallel to a rolling mark and the direction perpendicular to the same, and the surface roughness in the perpendicular direction is larger. Therefore, for improvement of the flatness of metal foil by coating, attention should be given to the perpendicular direction, in which the surface roughness is largest. Specifically, a surface roughness is measured at 10 or more positions using a stylus profiler with a measurement length of 1.25 mm in the direction perpendicular to the rolling direction of a metal foil coil, namely in the width direction of a metal foil coil, and the average value is adopted.

The relationship between the surface roughness of a metal foil with a planarization film and the characteristics of an organic EL device constructed thereon were studied in detail to find that the flatness of the film surface played important role for reducing a leakage current of the device. When the arithmetic average roughness Ra of a metal foil with a planarization film surface in the direction perpendicular to the rolling direction is 30 nm or less, the leakage current of an organic EL light emitting device can be suppressed to a practical level of $1E-4 \text{ A/m}^2$ or less. The leakage current of a device is determined by depositing on a phenyl group-modified silica film a lower electrode, a light emitter, and an upper electrode of a device in the mentioned order to construct a device; applying a voltage of 3 V between the lower electrode and the upper electrode; and dividing the obtained current by a device area. Since a light emitter is constituted with a plurality of layers and the total thickness is approx. from 100 to 150 nm, when the film surface is rough, the distance between the lower electrode and the upper electrode may be too small in some places, so that the leakage current of the device increases. When Ra of a metal foil with a planarization film exceeds 30 nm, it becomes a device with a leakage current above 1E-4 A/m$^2$, which is not suitable because the device efficiency may become poor and a short circuit may occur. A more preferable range of Ra for reducing a leakage current is 20 nm or less, and more preferably 15 nm or less.

The surface roughness of a planarization film reflects the surface roughness of a metal foil to be coated. As a rough target for realizing an Ra of a planarization film of 30 nm or less, the surface roughness Ra of a metal foil surface itself measured in the direction perpendicular to the rolling direction is 60 nm or less. However, even for a relatively rough metal foil, when a phenyl group-modified silica film is formed thick, planarization tends to be achieved more easily. Examples of a metal foil include a stainless steel foil, an aluminum foil, a titanium foil, a plated steel foil, and a copper foil. The thickness of a metal foil is preferably in a range where the foil can be handled without forming a fold or a wrinkle, and the flexibility is not impaired. Ordinarily, a range of from 30 μm to 150 μm is convenient for use, and a more preferable sheet thickness is from 35 μm to 80 μm.

An insulation coating may be provided on at least either surface of a metal foil. By using a metal foil with an insulation coating, the insulation performance of a metal foil after formation of a planarization film can be high and sure. Examples of a kind of an insulation film include a metallic oxide such as silica and alumina, an inorganic salt such as aluminum phosphate and calcium phosphates, and a heat stable resin such as polyimide and Teflon. A film of a metallic oxide may be formed, for example, by sputtering, vapor deposition, or CVD. A film of an inorganic salt may be formed, for example, by a coating method, such as a roll coater or spraying. A film of a heat stable resin may be formed, for example, by a coating method, such as a comma coater, a slot die coater, and spraying.

The film thickness of an insulation film is desirably from 0.1 μm to 10 μm. When the film thickness is 0.1 μm or more, insulation performance is imparted, even though it may not be sufficient, and therefore by adding a planarization film thereon, the insulation performance is improved. The film thickness of an insulation film beyond 10 μm is not preferable because a large crack may be generated in the insulation film or the film may be detached due to a film stress. A more preferable range of a film thickness, from which improvement of high insulation performance is expected, and a sound insulation film is obtainable, is from 0.5 μm to 5 μm. When the film thickness of an insulation film is so thin as 1 μm or less, the surface roughness of an insulation-coated metal foil tends to be slightly smoother than a metal foil itself. This is because a film can cover more or less the ruggedness of a metal foil. When the film thickness comes to exceed 1 μm, the roughness of an insulation film material itself comes to exert influence. In the case of an inorganic film, ruggedness attributable to crystal grain diameters appears. In the case of a heat stable resin, ruggedness attributable to fillers, or coating unevenness caused by coating a high viscosity resin appears. However, also in the case of an insulation-coated metal foil, insofar as Ra is 60 nm or less, the Ra of a planarization film can be made 30 nm or less similarly to the case of an immaculate metal foil.

When a stainless steel foil is used as a metal foil, a reflection film may be formed on at least either surface of the stainless steel foil. Since a stainless steel foil can be industrially produced inexpensively and is resistant to folding, it is superior as a flexible substrate for an electronic device, but the reflectance is as low as 60%. When a top emission-type organic EL light or an organic EL display is produced as an electronic device using a transparent lower electrode as depicted in FIG. 4(a), light is reflected repeatedly by the surface of a stainless steel foil. When the reflectance of the same is approx. 60%, a large portion of light is lost and the efficiency of the device is deteriorated. In contrast, when a reflection film with a reflectance of approx. 95% is formed on the surface of a stainless steel foil as depicted in FIG. 4(b), almost all the light is reflected by the reflection film, and therefore the efficiency of the device is significantly improved. Examples of a kind of reflection film having a reflectance as high as approx. 95% include pure Al, an Al alloy, pure Ag, and an Ag alloy. Examples of an Al alloy include an Al—Si alloy and an Al—Nd alloy. A reflection film can be formed by a sputter method, etc. Examples of an Ag alloy include an Ag—Nd alloy and a Ag—In alloy. The film thickness of a reflection film is desirably from 30 nm to 150 nm. When the film thickness of a reflection film is less than 30 nm, it becomes a semipermeable film, and a part the light is reflected rather by the stainless steel foil. When the film is formed beyond a thickness of 150 nm, the reflectance is saturated, and the cost performance with respect to a reflection film material declines. The film thickness of a reflection film is more preferably from 60 nm to 100 nm.

Since the film thickness of a reflection film is small, the surface roughness of a reflection film-formed stainless steel foil is substantially the same as the surface roughness of the stainless steel foil itself. In addition, in the case of a reflection film-formed stainless steel foil, insofar as Ra is 60 nm or less, the Ra of a planarization film can be made 30 nm or less similarly to an immaculate metal foil.

The film thickness of a planarization film is from 2 μm to 5 μm. When the thickness is less than 2 μm, the original ruggedness of a metal foil, an insulation-coated metal foil, a reflection film-formed stainless steel foil, or the like cannot be covered thoroughly. When the film thickness exceeds 5 μm, the film is apt to have a crack. A crack occurs on the film easily not only when the film is formed, but also when a stainless steel foil coated with a planarization film is bended as a flexible substrate. From viewpoints of coverage of ruggedness and prevention of cracking, the film thickness is more preferably from 2.5 μm to 4 μm.

A planarization film contains desirably 1 ppm to 5,000 ppm of Sn. The concentration of Sn can be measured by a SIMS (secondary ion mass spectrometry) analysis, or an X-ray fluorescence analysis. When the Sn concentration is less than 1 ppm, rapid film curing is difficult, and therefore continuous formation of a film on a coil by roll to roll may be sometimes difficult. When the Sn concentration exceeds 5,000 ppm, a film becomes hard and a crack may appear easily when bended.

Figure 1:
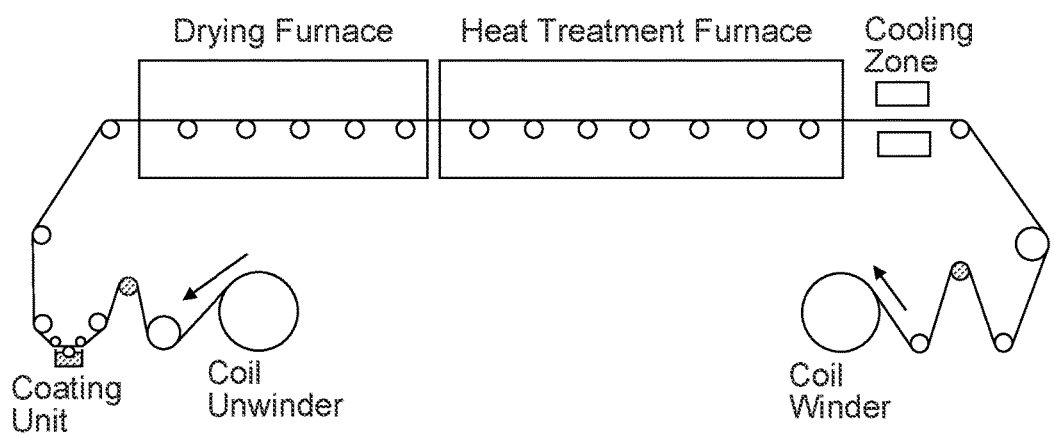
FIG. 1 is a schematic diagram of a roll to roll film formation apparatus.

After coating a metal foil coil, an insulation-coated metal foil, or a reflection film-formed stainless steel foil, a drying treatment is carried out at a temperature of 20° C. to 150° C. An object of a drying step is to remove a solvent or moisture contained in a coated film to form a dried film. When the drying temperature is higher than a resin synthesis temperature by vacuum distillation, a ladder polymer composing the resin may be softened, and therefore the drying temperature is desirably lower than the resin synthesis temperature. Although a dried film seems cured because ladder polymers therein are entangled each other forming an apparent network structure, when molecular movement becomes active by thermal vibrations, the ladder polymers are disentangled to develop flowability. There are 2 objects for a heat treatment step, namely to melt or soften ladder polymers composing a dried film, i.e. to make the same reflow, so as to planarize a film surface; and to promote crosslinking of the polymers after reflowing, so as to cure the film by forming a three-dimensional network. Reflowing is a phenomenon to occur in a temperature range higher than a resin synthesis temperature by vacuum distillation, and in a temperature range lower than a temperature, at which a film starts curing through advancement of three-dimensional crosslinking. There is no need for a special heat treatment process for reflowing, and insofar as a heat treatment is conducted at from 300° C. to 450° C., reflow occurs in the course of temperature increase to the heat treatment temperature, and immediately thereafter film curing advances by crosslinking. For smoothing the surface of a metal foil, a heat treatment in a horizontal condition as illustrated in FIG. 1 is effective. Since film curing is construction of a network structure by crosslinking, once a film is cured, it cannot reflow again. When the heat treatment temperature is lower than 300° C., crosslinking does not advance adequately, and a reactive group such as a silanol group remains in a film, and therefore the insulation performance becomes insufficient, and further moisture adsorbed by a silanol group, etc. may be released during production of an organic device to affect negatively the device, which is not favorable. When the heat treatment temperature is higher than 450° C., volume contraction takes place due to thermal degradation of a phenyl group to promote cracking, which is not favorable. A more preferable heat treatment temperature is from 360° C. to 420° C.

Examples of a phenyltrialkoxysilane to be used according to the present invention include phenyltrimethoxysilane, phenyltriethoxysilane, and phenyltripropoxysilane.

Examples of an organic solvent to be used for hydrolyzing a phenyltrialkoxysilane include methanol, ethanol, and propanol.

Examples of organic tin include dibutyltin diacetate, bis(acetoxydibutyltin)oxide, dibutyltin bis(acetylacetonate), dibutyltin bis(monobutyl maleate), dioctyltin bis(monobutyl maleate), and bis(lauroxydibutyltin)oxide.

An organic solvent to be distilled away during vacuum distillation also includes, in addition to an organic solvent used for hydrolyzing a phenyltrialkoxysilane, an alcohol to be generated by hydrolysis of a phenyltrialkoxysilane. Further, water generated by a condensation reaction of a hydrolyzed phenyltrialkoxysilane may be also contained.

Examples of an aromatic hydrocarbon solvent include toluene and xylene. An aromatic hydrocarbon solvent may be mixed with another organic solvent to the extent that the characteristics are not affected.

As an acid catalyst, hydrochloric acid, nitric acid, and phosphoric acid were also investigated; however, it was difficult to prepare a ladder polymer with a high molecular weight and to form a smooth film utilizing the reflowability as in the case of acetic acid. This is presumably because hydrolysis advances slowly in the case of acetic acid, which is a weak acid, compared to the case of hydrochloric acid, etc., and as the result the structure of an obtained ladder polymer is different For forming a film on a metal foil coil, an insulation-coated metal foil coil, or a reflection film-formed stainless steel foil coil, a roll to roll continuous film formation is carried out. Generally, the apparatus is constituted with a coil unwinding unit, a coating unit, a drying furnace, a heat treatment furnace, and a coil winding unit. The higher the sheet sending velocity is, the higher the productivity becomes; however, approx. 1 mpm to 20 mpm is usual. Examples of a method for coating include coating with a microgravure roll, a gravure roll, etc. as well as a slit coater, and screen printing. When both sides of a stainless steel foil are to be coated, film formation may be also conducted by dip coating. Drying is performed at from 20° C. to 150° C. for approx. 0.5 to 2 min. The atmosphere in the furnace during drying may be air or an inert gas such as nitrogen. A heat treatment is carried out while streaming an inert gas so as to suppress thermal degradation of a phenyl group. Although in the case of a continuous film formation apparatus, a substrate supplied into the heat treatment furnace entrains a small amount of air, even if approx. 1% of air is mixed, the film characteristics of a phenyl group-modified silica film according to the present invention are not affected. The equipment should be so designed that a film surface on the side to be equipped with a device does not touch rolls in the drying furnace and the heat treatment furnace. In winding, a protective film may be stuck to the film surface, or interleaving paper may be inserted for protection against a flaw. In this regard, instead of conducting drying and heat treatment consecutively, a coil with a dried film is once wound up, and only a heat treatment may be conducted anew. In this case 2 lines of a facility for producing a dried film and a facility for a heat treatment are necessary; however there is an advantage of being able to conduct each treatment at an optimum sheet sending velocity.

EXAMPLES

Next, the present invention will be described further by way of Examples. There is no need to say that the presented Examples in no way limit the scope of the present invention.

In the series of Test 1, a material with a sheet thickness of 100 μm listed in Table 1 was used as a metal foil. As the surface roughness of a metal foil, Ra was measured in the direction perpendicular to the rolling direction with a stylus profiler. The measurement length was 1.25 mm, and an average of 10 measurements at optional positions was adopted.

TABLE 1

| Experiment No. | 1-1 | 1-2 | 1-3 | 1-4 | 1-5 | 1-6 | 1-7 |
|---|---|---|---|---|---|---|---|
| Kind of metal foil used | Stainless steel (SUS304MW) | | | | | Stainless steel (SUS430H) | Titanium |
| Surface roughness of metal foil (nm) | | | 37 | | | 86 | 41 |
| Film thickness of phenyl group-modified silica film (μm) | | 2.3 | | 1.5 | | 4.8 | 3.5 |
| Coating liquid for phenyl group-modified silica film | A | B | C | B | C | A | A |
| Surface roughness of phenyl group-modified silica film (nm) | 10 | 12 | crack | 19 | 31 | 27 | 13 |

TABLE 1-continued

| Experiment No. | 1-1 | 1-2 | 1-3 | 1-4 | 1-5 | 1-6 | 1-7 |
|---|---|---|---|---|---|---|---|
| Flatness | VG | VG | UA | G | UA | G | VG |
| Curing time (min) | 1 | 30 | not evaluable | 30 | 5 | 1 | 1 |
| Roll to Roll applicability | VG | UA | UA | UA | UA | VG | VG |
| Overall evaluation | VG | UA | UA | UA | UA | G | VG |

"G" means "Good."
"VG" means "Very Good."
"UA" means "Unacceptable."

As a coating liquid for an organic group-modified silica film, 3 kinds of coating liquids A to C were prepared. All of coating liquids A to C are a coating liquid, which can form a silica-based film containing a phenyl group and having both heat stability and humidity resistance, and demonstrate as Examples and Comparative Examples an influence of difference in a synthetic method and a catalyst for synthesis.

The coating liquid A is a coating liquid for a phenyl group-modified silica film exhibiting high planarization property and curability in a short time according to the present invention. In ethanol, 0.3 mol of acetic acid and 0.012 mol of dibutyltin diacetate were added as a catalyst to 1 mol of phenyltriethoxysilane, which was hydrolyzed with 3 mol of water. The product liquid was refluxed in a nitrogen stream for 3 hours, and heated up gradually avoiding bumping using a rotary evaporator, such that the organic solvent was removed by vacuum distillation finally at 190° C. to obtain a resin. The obtained resin was dissolved in toluene, and then filtrated to yield a clarified coating liquid. The viscosity of the coating liquid was 9 mPa·s. The weight-average molecular weight reduced to styrene Mw determined by GPC was 60,000. In an infrared absorption spectrum, there were 2 peaks at 1,035 cm$^{-1}$ and 1,135 cm$^{-1}$ indicating presence of a ladder polymer.

The coating liquid B was produced as described below as a coating liquid of Comparative Example using a resin prepared by polymerizing phenyltriethoxysilane to a high molecular weight in the presence of an alkali catalyst. To 1 mol of phenyltriethoxysilane in a methyl isobutyl ketone solution, 0.2 mol of sodium acetate, 0.01 mol of potassium hydroxide, and 3 mol of water were added, and the solution was refluxed at 50° C. for 12 hours, then left standing to remove a water phase, and an organic phase was washed with water 3 times. After removing a solvent at 80° C. under reduced pressure, the obtained resin was dissolved in toluene. A weight-average molecular weight reduced to styrene was measured to find 200,000. In an infrared absorption spectrum, there were 2 peaks at 1,035 cm$^{-1}$ and 1,135 cm$^{-1}$ indicating presence of a ladder polymer.

The coating liquid C was produced as Comparative Example by simply hydrolyzing phenyltriethoxysilane in the presence of a catalyst as described below. In an ethanol solvent, 0.1 mol of acetic acid and 0.01 mol of tetraethoxy titanium were added to 1 mol of phenyltriethoxysilane, which was hydrolyzed with 3 mol of water, and stirred at room temperature for 12 hours. The weight-average molecular weight reduced to styrene was 300. In an infrared absorption spectrum, there was only a peak at 1,050cm$^{-1}$, and there was no data indicating presence of a ladder polymer.

The coating liquids A to C were coated respectively on a 12 cm-square metal foil by a spin coater into a film form. The film thickness was regulated by the rotating speed of the spin coater.

A film thickness of a phenyl group-modified silica film was measured by cutting a metal foil with a film and observing the cross-section with a scanning electron microscope (SEM). When the average value of a surface roughness Ra of a planarization film measured 10 times in the direction perpendicular to the rolling direction with a stylus profiler was 30 nm or less, the flatness was rated as good (i.e., G), when it was 15 nm or less the flatness was rated as very good (i.e., VG), and when it was beyond 30 nm, it was rated as unacceptable (i.e., UA).

After drying at room temperature, a heat treatment was performed with an infrared light heating furnace in a nitrogen atmosphere by elevating the temperature to 400° C. in 0.5 min; maintaining it for a period of 1 min, 2 min, 5 min, 15 min, or 30 min respectively, and thereafter the heater switch was turned off. In these cases, the cooling time down to 200° C. was 1 min. The hardness of a film after a heat treatment was evaluated by pencil hardness according to JIS K5600. A leakage current of a phenyl group-modified silica film was measured by forming a 1 cm-square platinum upper electrode on a phenyl group-modified silica film using a mask by an ion coater, using the same as an upper electrode and a stainless steel foil as a lower electrode, and applying 100 V between both the electrodes. A curing time was defined as the shortest heat treatment retention time required to satisfy a pencil hardness of 3H or higher, and a leakage current of 1E-6 A/cm$^2$ or less. When the curing time is 2 min, a roll to roll continuous film formation is realistic and therefore the film was rated as good (i.e., G), when it was 1 min, since a roll to roll continuous film formation should be further realistic, it was rated as very good (i.e., VG), and when it was 5 min or more, it was rated as unacceptable (i.e., UA). When both the flatness and the roll to roll applicability were satisfied, since it is inferred that a coil with an insulation film functionable as an electronic device substrate can be obtained, the overall evaluation was rated as acceptable.

Experiment Nos. 1-1, 1-6, and 1-7 are Examples with the coating liquid A according to the present invention. The coating liquid A according to the present invention is polymerized to a high molecular weight and in a form of a dried film with ladder polymers entangled each other. By a heat treatment, molecular movement of polymers is made active so that the same is made flowable and smoothing is promoted. Since the coating liquid A has a properly high molecular weight and contains a residual reactive group such as a silanol group, its smoothing and curing in a short time are well balanced. When the surface of a metal foil is rough, as shown in No. 1-6, the surface of a film becomes slightly rough, but is still at a practically acceptable level. Nos. 1-2 and 1-4 are Comparative Examples using the coating liquid B. The coating liquid B is also polymerized to a high molecular weight and exhibits reflowability; however since it is polymerized with an alkali catalyst, the residual amount of a reactive group is low and therefore film curing needs a longer time. The curing time is long presumably because if a reactive group does not exist at a defective site, a phenyl group needs to be thermally degraded first to form a reactive group such as a silanol group, and then polymerization between polymers proceeds or a reaction with a polymer terminal proceeds. The length of the curing time was not dependent on the film thickness. Nos. 1-3 and 1-5 are Comparative Examples using the coating liquid C. Since the coating liquid C contained low molecular weight hydrolyzed products of phenyltriethoxysilane, the volume contraction due to a dehydration condensation reaction during film formation was extremely large, so that cracking occurred frequently. When the film thickness was small as exemplified by No. 1-5, cracking was suppressed; however since it was not in a form of a ladder polymer, it lacked reflowability and the smoothing capability was low.

In Test 2, a coating liquid for a phenyl group-modified silica film was synthesized under various conditions. In an ethanol solvent, acetic acid, organic tin, and water were added under the conditions set forth in Table 2 to 1 mol of phenyltriethoxysilane to conduct hydrolysis. After refluxing in a nitrogen stream at 80° C. for 5 hours, a solvent was removed by vacuum distillation with a rotary evaporator. The temperature was raised gradually during the vacuum distillation, and the maximum temperature was recorded as the vacuum distillation temperature in Table 2. The produced coating liquid was coated to a thickness of 3 μm by a spin coater. Drying was conducted at 80° C. for 1 min. A heat treatment was performed with an infrared light heating furnace in a nitrogen atmosphere by elevating the temperature to the heat treatment temperature described in Table 2 in 0.5 min; maintaining it for a period of 1 min, 2 min, 5 min, 15 min, or 30 min respectively, and thereafter the heater switch was turned off. In these cases, the cooling time down to 200° C. was 1 min. The test conditions for evaluation were identical with Test 1.

TABLE 2

| | Experiment No. | | | | | | | | | | | | | |
|---|---|---|---|---|---|---|---|---|---|---|---|---|---|---|
| | 2-1 | 2-2 | 2-3 | 2-4 | 2-5 | 2-6 | 2-7 | 2-8 | 2-9 | 2-10 | 2-11 | 2-12 | 2-13 | 2-14 |
| Acetic acid mol number | 0.08 | 0.11 | 0.5 | 0.98 | 1.15 | 0.5 | 0.5 | 0.5 | 0.5 | 0.5 | 0.5 | 0.5 | 0.5 | 0.5 |
| Organic tin | dibutyltin diacetate | | | | | | | | | dibutyltin bis(acetylacetonate) | | | | |
| Organic tin mol number | 0.01 | 0.01 | 0.01 | 0.01 | 0.01 | 0.004 | 0.005 | 0.01 | 0.05 | 0.06 | 0.01 | 0.01 | 0.01 | 0.01 |
| Water mol number | 3 | 3 | 3 | 3 | 3 | 3 | 3 | 3 | 3 | 3 | 1.8 | 2 | 4 | 4.2 |
| Vacuum distillation temp. (° C.) | 190 | 190 | 190 | 190 | Not evaluable | 190 | 190 | 190 | 190 | Not evaluable | 190 | 190 | 190 | 190 |
| Heat treatment temp. (° C.) | 400 | 400 | 400 | 400 | due to gelation before vacuum distillation | 400 | 400 | 400 | 400 | due to gelation before vacuum distillation | 400 | 400 | 400 | Not evaluable due to insolubility of resin |
| Surface roughness of phenyl group-modified silica film (nm) | 32 | 18 | 12 | 11 | | 9 | 11 | 13 | 28 | | 8 | 14 | 14 | |
| Flatness | UA | G | VG | VG | | VG | VG | VG | G | | G | VG | VG | |
| Curing time (min) | 1 | 1 | 1 | 2 | | 5 | 2 | 1 | 1 | | 15 | 1 | 1 | |
| Roll to Roll applicability | VG | VG | VG | G | | UA | G | VG | VG | | UA | VG | VG | |
| Overall evaluation | UA | G | VG | G | UA | UA | G | VG | G | UA | UA | VG | VG | UA |

| | Experiment No. | | | | | | | | | | | |
|---|---|---|---|---|---|---|---|---|---|---|---|---|
| | 2-15 | 2-16 | 2-17 | 2-18 | 2-19 | 2-20 | 2-21 | 2-22 | 2-23 | 2-24 | 2-25 | 2-26 |
| Acetic acid mol number | 0.5 | 0.5 | 0.5 | 0.5 | 0.5 | 0.5 | 0.5 | 0.5 | 0.5 | 0.5 | 0.5 | 0.5 |
| Organic tin | dibutyltin diacetate | | | | | | | | | | | |
| Organic tin mol number | 0.01 | 0.01 | 0.01 | 0.01 | 0.01 | 0.01 | 0.01 | 0.01 | 0.01 | 0.01 | 0.01 | 0.01 |
| Water mol number | 3 | 3 | 3 | 3 | 3 | 3 | 3 | 3 | 3 | 3 | 3 | 3 |
| Vacuum distillation temp. (° C.) | 150 | 160 | 180 | 200 | 210 | 230 | 190 | 150 | 150 | 190 | 150 | 150 |
| Heat treatment temp. (° C.) | 400 | 400 | 400 | 400 | 400 | Not evaluable | 290 | 320 | 380 | 420 | 450 | 480 |
| Surface roughness of phenyl group-modified silica film (nm) | Cissing occurred | 12 | 14 | 14 | 16 | due to insolubility of resin | 9 | 10 | 12 | 14 | 18 | Not evaluable due to cracking |

TABLE 2-continued

| Flatness | UA | VG | VG | VG | G |  | VG | VG | VG | VG | G |  |
|---|---|---|---|---|---|---|---|---|---|---|---|---|
| Curing time (min) | 30 | 2 | 1 | 1 | 1 |  | * | 2 | 1 | 1 | 1 |  |
| Roll to Roll applicability | UA | G | VG | VG | VG |  | UA | G | VG | VG | VG |  |
| Overall evaluation | UA | G | VG | VG | G | UA | UA | G | VG | VG | G | UA |

* Even after a heat treatment for 30 min, the leakage current did not go down to 1E–6 A/cm$^2$ or less.
"G" means "Good."
"VG" means "Very Good."
"UA" means "Unacceptable."

In Experiment No. 2-1, since the amount of acetic acid was low, the molecular weight of a ladder polymer was not increased adequately and the reflowability was low. In No. 2-5, since the amount of acetic acid was too high, gelation occurred during refluxing, and therefore a coating liquid could not be synthesized. In No. 2-6, since the organic tin amount was low, the heat treatment time became long. In No. 2-10, since the addition amount of organic tin was too high, gelation occurred during refluxing, and therefore a coating liquid could not be synthesized. In No. 2-11, since the water amount was low, an ethoxy group in phenyltri-ethoxysilane as a source material remained excessively, and therefore the heat treatment time became long. In No. 2-14, since the water amount was too high, the resin became poorly soluble, and therefore a coating liquid could not be obtained. This is presumably because a polymer having a randomly 3-dimensional network structure was produced at the same time in addition to a ladder polymer. In No. 2-15, since the vacuum distillation temperature was low, a low molecular weight polycondensation product remained, which volatilized during a heat treatment to cause cissing. Due to a large number of cissing, a short circuit occurred, so that the film did not function as an insulation film. In No. 2-20, since the vacuum distillation temperature was too high, ladder polymers were connected 3-dimensionally to form a resin with a high molecular weight, which was not dissolved in a solvent. In No. 2-21, since the heat treatment temperature was low, a condensation reaction of an ethoxy group or a silanol group in a film was not completed, and therefore a high leakage current appeared due to the residual polar groups. In No. 2-26, since the heat treatment temperature was too high, degradation of a phenyl group advanced too far, and cracking occurred. Experiments with other Nos. in Table 2 were within the scope of the present invention, and the overall evaluations therefor were rated as acceptable.

Lastly, using a coating liquid with the composition of Experiment No. 2-8, a roll to roll film formation test was performed. For the film formation test, a SB finished stainless steel foil NSSC190 with a thickness of 50 μm, a width of 300 mm, and a length of 200 m was used (NSSC190 is a proprietary steel grade of Nippon Steel & Sumikin Stainless Corporation and almost equal to SUS 444. SB stands for super-bright (finishing) and is a proprietary finishing technology of Nippon Steel & Sumikin Materials Co., Ltd.). The stainless steel foil was wound around a 6-inch Bakelite core to a reel, which was loaded on the unwinding unit. With respect to a coating liquid, the viscosity was 10 mPa·s, and the solid concentration was 31%. Coating was carried out with a plurality of gravure rolls having a different cell volume, and the one giving a dried film thickness of approx. 3 μm was selected. The schema of a used R2R (roll to roll) film formation apparatus was the same as that depicted in FIG. 1. The stainless steel foil was conveyed under a total tension of 100 N. In the winding unit, an EPC (edge position control) sensor was installed for adjusting the edge of the foil and the foil was wound up around a 6-inch Bakelite core. A heating system using an infrared light panel heater and hot stream was applied to both of the drying furnace and the heat treatment furnace. The drying furnace had a total length of 8 m, and operated with an inner furnace temperature set at 100° C. As the hot stream, the air was heated to 100° C. and supplied. The heat treatment furnace had a length of 12 m and the inner furnace temperature was set at 380° C. As the hot stream, nitrogen was heated to 380° C. and supplied. In the cooling zone, the air at room temperature was blown from up and down to the stainless steel foil. The length of the cooling zone was 2 m. The total length from the unwinding unit to the winding unit was 35 m. The stainless steel foil was sent at a convey speed of 4 mpm, and after receiving the coating, drying, and heating treatments, wound up as a stainless steel foil with a planarization film with a length of approx. 150 m to a reel.

According to calculations, the drying treatment time is 2 min, and the heat treatment time is 3 min. It was found that, when a stainless steel foil, to which a thermocouple was attached, was conveyed at 4 mpm, it required approx. 1 min for the substrate temperature of the stainless steel foil to rise from an initial temperature to 100° C. in the drying furnace, and the retention time at 100° C. was approx. 1 min. With respect to the heat treatment furnace, it was found that it required 1.5 min after the stainless steel foil at approx. 100° C. entered the heat treatment furnace until the temperature of the stainless steel foil rose to 380° C., and the retention time at 380° C. was 1.5 min. Therefore, a solvent such as toluene in a film coated by a gravure coater is removed by evaporation in the drying furnace, and after entry in the heat treatment furnace the film passed through a temperature range of from 200 to 250° C. convenient for reflowing in approx. 1 min to level the film, followed by film curing within the remaining 2 min.

Figure 3:
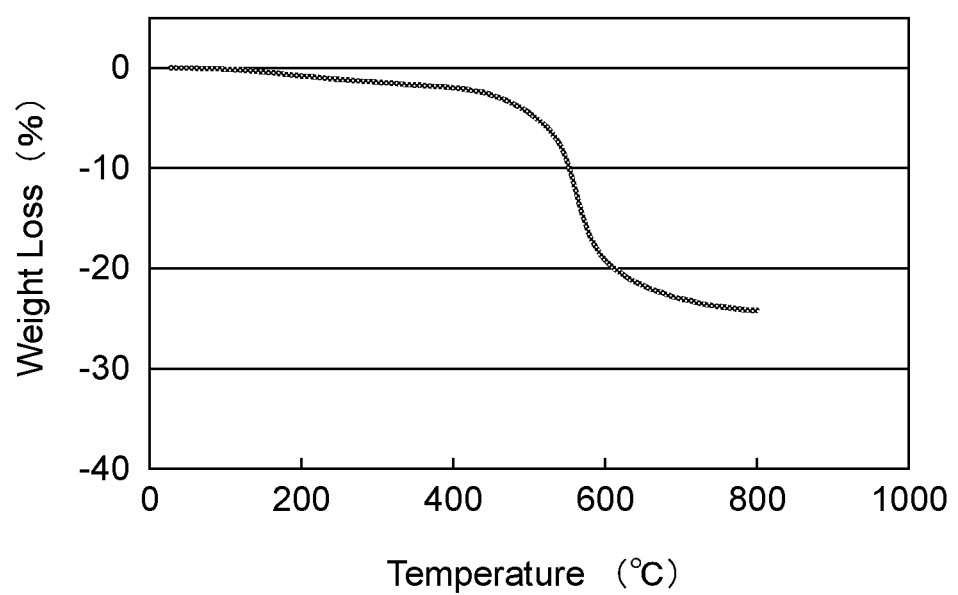
FIG. 3 is a thermogravimetric analysis result of a film according to Example formed with a coating liquid A according to the present invention.

A pencil hardness was measured according to JIS K5600 with respect to the obtained roll of the stainless steel foil with a planarization film to find that the hardness was 5H. A cross-section of the stainless steel foil with a planarization film was observed with a SEM to find that the film thickness was 3.0 μm. The leakage current was measured after placing a 1 cm-square upper electrode to find 1E-9 A/cm$^2$. The surface roughness Ra in the width direction of the coil measured by a stylus profiler was 12 nm. For testing the heat stability, the film was scraped off and subjected to a thermogravimetric analysis in a nitrogen gas. The measurement result was presented in FIG. 3. A temperature, up to which the weight was decreased by 5%, was above 500° C., indicating that heat stability up to 400° C. was fully secured. Next, for evaluating the humidity resistance, a substrate with the film was stored in a thermo-hygrostat at 85° C. and 85% RH (relative humidity), and a change in a leakage current was examined. The leakage current was without any change throughout the storage for 200 hours at 1E-9 A/cm$^2$, confirming no sign of deterioration of the film quality.

In Test 3, the coating liquid A of Test 1 was used. As a metal foil, a material listed in Table 3 with a sheet thickness of 80 μm was used. An insulation coating material and a method for forming a film of an insulation coating material were as presented in Table 3. The thickness of an insulation coating was determined by masking a part of the surface to form a region where a film is not formed, and measuring the step height at the boundary between a part with a film and a region without a film using a step profiler DEKTAK. As the surface roughness of an insulation-coated metal foil, Ra was measured in the direction perpendicular to the rolling direction with a stylus profiler. The measurement length was 1.25 mm, and an average of 10 measurements at optional positions was adopted. The method for forming a phenyl group-modified silica film, the film thickness of a phenyl group-modified silica film, the surface roughness of a phenyl group-modified silica film, evaluation of the flatness, the curing time, the roll to roll applicability were the same as Test 1. A leakage current was measured by applying a voltage of 100 V between a 1 cm-square upper electrode formed on a phenyl group-modified silica film and a stainless steel foil. When the leakage current was less than 1E-6 A/cm$^2$, since it was confirmed that devices constructed in the same substrate were insulated and able to function independently, the device compatibility as an insulation substrate was rated as Good (i.e., G). When it was less than 1E-8 A/cm$^2$, since a function at a higher voltage, or high reliability in a high temperature and high humidity environment was achieved, it was rated as Very Good (i.e., VG). With respect to the row of overall evaluation including device compatibility, judgement was made based on both the roll to roll applicability and the device compatibility as an insulation substrate. The figures in parentheses in the row of surface roughness of insulation-coated metal foil in Table 3 are reference values for the surface roughness of a metal foil without insulation coating.

As obvious from a comparison between Experiment Nos. 3-1 and 3-5, or a comparison between Nos. 3-2 and 3-6, in general the larger the film thickness of a phenyl group-modified silica film is, the smaller the leakage current becomes. In Experiment No. 3-2, vapor deposited SiO$_2$ and a phenyl group-modified silica film are coated one on another and the total film thickness is 2.45 μm, but the leakage current is lower than that of Experiment No. 3-5 with a phenyl group-modified silica film having a thickness of 4.1 μm. Experiment No. 3-3 is identical. This is because in Experiment No. 3-5, a film defect caused when a foreign substance got mixed in a coating liquid for a phenyl group-modified silica film, or a foreign substance entered inevitably from an environment for film formation has an influence thereon. When multiple films, which may be thin, are coated, even when a film defect is generated during formation of a phenyl group-modified silica film, so long as an insulation coating layer just below the film defect is sound, the insulation performance can be maintained. Experiment No. 3-10 indicates that by increasing the thickness of an insulation coating material and the thickness of a phenyl group-modified silica film, the leakage current can be reduced, even when a metal foil is relatively rough.

A roll to roll film formation test was conducted using a stainless steel foil coil of MW finished SUS 304 produced by Nippon Steel & Sumikin Materials Co., Ltd. having a thickness of 70 μm, a width of 400 mm, and a length of 150 m. The 304 MW coil was set on a roll to roll vacuum film formation apparatus, left standing in vacuum overnight, and then a film was formed by sputtering SiO$_2$ to a film thickness of 100 nm using a SiO$_2$ target. The film formation speed was 0.5 mpm. A coating liquid having the composition of Experiment No. 2-3, a viscosity of 15 mPa·s, and a solid concentration of 35% was coated with a roll to roll slit die coater on a stainless steel foil coil having been sputtered with SiO$_2$. The film thickness of a phenyl group-modified silica film was regulated to 3.2 μm by means of a liquid feed pressure and a shim thickness. After coating by a slit die, drying in a

TABLE 3

Experimental conditions and results of Test 3

| Experiment No. | 3-1 | 3-2 | 3-3 | 3-4 | 3-5 | 3-6 | 3-7 | 3-8 | 3-9 | 3-10 |
|---|---|---|---|---|---|---|---|---|---|---|
| Kind of metal foil used | Stainless steel (SUS304MW) | | | | | | | | Stainless steel (SUS430H) | |
| Insulation coating material | none | SiO$_2$ | Al$_2$O$_3$ | Polyimide | none | SiO$_2$ | Al$_2$O$_3$ | Polyimide | none | SiO$_2$ |
| Method of film formation of insulation coating material | none | vapor deposit | sputtering | coating | none | CVD | sputtering | coating | none | CVD |
| Thickness of insulation coating (μm) | none | 0.15 | 0.2 | 4 | none | 2 | 0.2 | 4 | none | 2 |
| Surface roughness of insulation-coated metal foil (nm) | (37) | 35 | 33 | 32 | (37) | 30 | 33 | 32 | (86) | 40 |
| Film thickness of phenyl group-modified silica film (μm) | | 2.3 | | | | 4.1 | | | | 4.8 |
| Surface roughness of phenyl group-modified silica film (nm) | 10 | 10 | 9 | 9 | 8 | 6 | 7 | 6 | 27 | 10 |
| Flatness | VG | VG | VG | VG | VG | VG | VG | VG | G | VG |
| Curing time (min) | 1 | 1 | 1 | 1 | 1 | 1 | 1 | 1 | 1 | 1 |
| Roll to Roll applicability | VG | VG | VG | VG | VG | VG | VG | VG | VG | VG |
| Leakage current (A/cm2) | 2.0E−07 | 9.9E−09 | 8.7E−09 | 3.0E−10 | 8.0E−08 | 4.1E−11 | 6.1E−10 | 1.8E−11 | 7.8E−08 | 5.5E−11 |
| Device compatibility as insulation substrate | G | VG | VG | VG | G | VG | VG | VG | G | VG |
| Overall evaluation including device compatibility | G | VG | VG | VG | G | VG | VG | VG | G | VG |

"G" means "Good," and "VG" means "Very Good."

drying furnace set at 100° C., and winding, a coil with a dried film of a phenyl group-modified silica film was produced. Thereafter, the coil with a dried film was heat-treated at 400° C. for 2 min in a roll to roll curing furnace. Finally, a coil of SUS 304 MW, on which a 100 nm-SiO$_2$ film and a 3.2 μm-phenyl modified silica film were formed, was obtained. A small specimen was sliced out from the coil, and the leakage current was measured to find that it was 1E-9 A/cm$^2$ by application of 100 V.

In Test 4, the coating liquid A of Test 1 was used. As a metal foil, a material listed in Table 4 with a sheet thickness of 30 μm was used. A reflection film material was as presented in Table 4. Each film was formed by a sputtering method. The thickness of a reflection film was determined by masking a part of the surface to form a region where a film was not formed, and measuring the step height at the boundary between a part with a film and a region without a film using a step profiler DEKTAK. As the surface roughness of a reflection film-formed stainless steel foil, Ra was measured in the direction perpendicular to the rolling direction with a stylus profiler. The measurement length was 1.25 mm, and an average of 10 measurements at optional positions was adopted. The reflectance of a reflection film-formed stainless steel foil refers to diffuse reflection at a wavelength of 600 nm. The method for forming a phenyl group-modified silica film, the film thickness of a phenyl group-modified silica film, the surface roughness of a phenyl group-modified silica film, evaluation of the flatness, the curing time, the roll to roll applicability were the same as Test 1. The current efficiency was evaluated as follows. OLED light emitting devices were produced in Experiment No. 4-1 with a constitution of FIG. 4(a) and in Experiment Nos. 4-2 and 4-3 with a constitution of FIG. 4(b), meanwhile the material and the film thickness with respect to each member from 42 to 46 were identical. The brightness was measured by applying a current of 100 A/m$^2$ to an OLED light emitting device constructed on the stainless steel foil with a planarization film obtained in Experiment No. 4-1. The brightness was measured by applying a current of 100 A/m$^2$ to each of OLED light emitting devices constructed on the stainless steel foils with a planarization film obtained in Experiment Nos. 4-2 and 4-3. With reference to the brightness of the OLED device in Experiment No. 4-1 as 1, the brightness of the OLED device in Experiment No. 4-2 was 1.9, and the brightness of the OLED device in Experiment No. 4-3 was 2.1, namely brightness approx. 2 times as high as the reference was obtained by applying the same current. With respect to device compatibility as a substrate with a reflection film, when the current efficiency was 1.5-fold or more that of a substrate without a reflection film (Experiment No. 4-1), it was rated as Very Good (i.e., VG). With respect to the row of overall evaluation including device compatibility, judgement was made based on both the roll to roll applicability and the device compatibility as substrate with reflection film. It is obvious that when the surface reflectance of a stainless steel foil before forming a phenyl group-modified silica film is high, a device with a high current efficiency can be constructed. The figures in parentheses in the row of surface roughness of reflection film-formed stainless steel foil in Table 4 are reference values for the surface roughness of a stainless steel foil without a reflection film.

TABLE 4

Experimental conditions and results of Test 4

| | Experiment No. | | |
|---|---|---|---|
| | 4-1 | 4-2 | 4-3 |
| Kind of stainless steel foil used | | Stainless steel (NSSC190SB) | |
| Reflection film material | none | Al—Si (1%) | Ag |
| Thickness of reflection film (μm) | none | 0.1 | 0.07 |
| Surface roughness of reflection film-formed stainless steel foil (nm) | (29) | 27 | 28 |
| Reflectance of reflection film-formed stainless steel foil (%) | 60.2 | 91.8 | 98.2 |
| Film thickness of phenyl group-modified silica film (μm) | | 3 | |
| Surface roughness of phenyl group-modified silica film (nm) | 8 | 8 | 8 |
| Flatness | VG | VG | VG |
| Curing time (min) | 1 | 1 | 1 |
| Roll to Roll applicability | VG | VG | VG |
| Current efficiency | 1.0 | 1.9 | 2.1 |
| Device compatibility as substrate with reflection film | G | VG | VG |
| Overall evaluation including device compatibility | G | VG | VG |

"G" means "Good," and
"VG" means "Very Good."

A roll to roll film formation test was conducted using a stainless steel foil coil of SB finished NSSC 190 produced by Nippon Steel & Sumikin Materials Co., Ltd. having a thickness of 50 μm, a width of 300 mm, and a length of 150 m. The NSSC 190 SB coil was set on a roll to roll vacuum film formation apparatus, left standing in vacuum overnight, and then a film was formed by sputtering Al to a film thickness of 70 nm using an Al target. The film formation speed was 2 mpm. A coating liquid having the composition of Experiment No. 2-3, a viscosity of 15 mPa·s, and a solid concentration of 35% was coated with a roll to roll slit die coater on a stainless steel foil coil having been sputtered with an Al film. The film thickness of a phenyl group-modified silica film was regulated to 3.2 μm by means of a liquid feed pressure and a shim thickness. After coating by a slit die, drying in a drying furnace set at 100° C., and winding, a coil with a dried film of a phenyl group-modified silica film was produced.

Thereafter, the coil with a dried film was heat-treated at 400° C. for 2 min in a roll to roll curing furnace. Finally, a coil of NSSC 190 SB, on which a 70 nm-Al film and a 3.2 μm-phenyl modified silica film were formed, was obtained. A small specimen was sliced out from the coil, and an OLED device was measured to obtain a current efficiency of 2.0 with reference to the current efficiency of the device in Experiment No. 4-1 as 1.

REFERENCE SIGNS LIST

41 STAINLESS STEEL FOIL
42 TRANSPARENT ELECTRODE (LOWER ELECTRODE)
43 POSITIVE HOLE TRANSPORT LAYER
44 LIGHT EMISSION LAYER
45 ELECTRON TRANSPORT LAYER
46 TRANSLUCENT ELECTRODE (UPPER ELECTRODE)
47 REFLECTION FILM

What is claimed is:

1. A coating liquid for a planarization film prepared by adding into an organic solvent, with respect to 1 mol of a phenyltrialkoxysilane, 0.1 mol to 1 mol of acetic acid and 0.005 mol to 0.05 mol of organic tin as a catalyst, hydrolyzing the silane with 2 mol to 4 mol of water, then distilling away the organic solvent at a temperature of 160° C. to 210° C. under reduced pressure to yield a resin, and dissolving the resin in an aromatic hydrocarbon solvent.

2. A method for producing a reflection film-formed stainless steel foil coil with a planarization film, by which the coating liquid according to claim 1 is coated continuously onto a reflection film-formed surface of a reflection film-formed stainless steel foil coil, having a reflection film formed on at least either surface of the metal foil coil, to a film thickness of 2.0 μm to 5.0 pm, the coated foil is passed through a heat treatment furnace in an inert gas atmosphere at between 300° C. and 450° C. for letting the coated film reflow and cure, and then the coated foil is wound up.

3. A method for producing a coating liquid for a planarization film comprising: adding into an organic solvent, with respect to 1 mol of a phenyltrialkoxysilane, 0.1 mol to 1 mol of acetic acid and 0.005 mol to 0.05 mol of organic tin as a catalyst, hydrolyzing the silane with 2 mol to 4 mol of water, then distilling away the organic solvent at a temperature of 160° C. to 210° C. under reduced pressure to yield a resin, and dissolving the resin in an aromatic hydrocarbon solvent.

4. A method for producing a metal foil coil with a planarization film, by which the coating liquid according to claim 1 is coated continuously onto a metal foil coil to a film thickness of 2.0 μm to 5.0 μm, the coated foil is passed through a heat treatment furnace in an inert gas atmosphere at between 300° C. and 450° C. for letting the coated film reflow and cure, and then the coated foil is wound up.

5. A metal foil coil with a planarization film, in which the surface of the metal foil coil is coated with a phenyl group-modified silica film with a film thickness of 2.0 μm to 5.0 μm and Ra of 30 nm or less in the direction perpendicular to the rolling direction, formed by coating the coating liquid according to claim 1 onto a metal foil coil, and thereafter letting the coated film reflow and cure by a heat treatment process.

6. The metal foil coil according to claim 5, wherein the metal foil is a stainless steel foil.

7. The method for producing a metal foil coil according to claim 4, wherein the metal foil is a stainless steel foil coil.

8. An insulation-coated metal foil coil with a planarization film, in which the surface of the insulation-coated metal foil coil is coated with a phenyl group-modified silica film with a film thickness of 2.0 μm to 5.0 μm and Ra of 30 nm or less in the direction perpendicular to the rolling direction, formed by coating the coating liquid according to claim 1 onto an insulation-coated surface of an insulation-coated metal foil coil having an insulation film coated on at least either surface of the metal foil coil, and thereafter letting the coated film reflow and cure by a heat treatment process.

9. A method for producing an insulation-coated metal foil coil with a planarization film, by which the coating liquid according to claim 1 is coated continuously onto an insulation-coated surface of an insulation-coated metal foil coil, having an insulation film coated on at least either surface of the metal foil coil, to a film thickness of 2.0 μm to 5.0 μm, the coated foil is passed through a heat treatment furnace in an inert gas atmosphere at between 300° C. and 450° C. for letting the coated film reflow and cure, and then the coated foil is wound up.

10. A reflection film-formed stainless steel foil coil with a planarization film, in which the surface of the reflection film-formed stainless steel foil coil is coated with a phenyl group-modified silica film with a film thickness of 2.0 μm to 5.0 μm and Ra of 30 nm or less in the direction perpendicular to the rolling direction, formed by coating the coating liquid according to claim 1 onto a reflection film-formed surface of a reflection film-formed stainless steel foil coil, having a reflection film formed on at least either surface of the metal foil coil, and thereafter letting the coated film reflow and cure by a heat treatment process.

* * * * *